United States Patent
Tapily et al.

(10) Patent No.: US 10,483,109 B2
(45) Date of Patent: Nov. 19, 2019

(54) SELF-ALIGNED SPACER FORMATION

(71) Applicant: Tokyo Electron Limited, Minato-ku, Tokyo (JP)

(72) Inventors: Kandabara N. Tapily, Mechanicville, NY (US); Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/484,917

(22) Filed: Apr. 11, 2017

(65) Prior Publication Data

US 2017/0294310 A1    Oct. 12, 2017

Related U.S. Application Data

(60) Provisional application No. 62/321,426, filed on Apr. 12, 2016.

(51) Int. Cl.
*G03F 7/16*    (2006.01)
*H01L 21/033*  (2006.01)
(Continued)

(52) U.S. Cl.
CPC ............ *H01L 21/0337* (2013.01); *G03F 7/16* (2013.01); *G03F 7/168* (2013.01); *G03F 7/2004* (2013.01); *G03F 7/32* (2013.01); *G03F 7/38* (2013.01); *H01L 21/0276* (2013.01); *H01L 21/0332* (2013.01); *H01L 21/0335* (2013.01)

(58) Field of Classification Search
CPC .......... H01L 21/02712; H01L 21/0228; H01L 21/0332; H01L 21/0335; H01L 21/0337; H01L 21/0338; H01L 21/31116; H01L 21/0276; G03F 7/16; G03F 7/168; G03F 7/2004; G03F 7/32; G03F 7/38; G03F 7/40

USPC ....... 438/695, 706, 710, 712, 714, 720, 754, 438/763, 366, 445, 723

See application file for complete search history.

(56) References Cited

U.S. PATENT DOCUMENTS 7,745,080 B2 *  6/2010  Nakamura ............... G03G 9/09
                                                     399/223
8,278,221 B2 * 10/2012  Koh ..................... H01L 21/0337
                                                     438/700

(Continued)

FOREIGN PATENT DOCUMENTS

JP    2009094279 A    4/2009
JP    2015156414 A    8/2015

OTHER PUBLICATIONS

Korean Intellectual Property Office, Office Action for related korean patent application No. 10-2017-0047511, dated Jun. 18, 2018, 12 pages.

(Continued)

*Primary Examiner* — Lan Vinh

(57) ABSTRACT

A method of self-aligned spacer formation is described. According to one embodiment of the invention, a substrate processing method is provided, where the method includes forming a sacrificial film over a substrate, creating a pattern in the sacrificial film, conformally depositing a first spacer layer over the patterned sacrificial film, removing horizontal portions of the first spacer layer while substantially leaving vertical portions of the first spacer layer, and selectively depositing a second spacer layer on the first spacer layer.

20 Claims, 13 Drawing Sheets

(51) Int. Cl.
G03F 7/20 (2006.01)
G03F 7/32 (2006.01)
G03F 7/38 (2006.01)
H01L 21/027 (2006.01)

(56) References Cited

U.S. PATENT DOCUMENTS

| | | | |
|---|---|---|---|
| 9,165,765 B1* | 10/2015 | Raley | H01L 21/0234 |
| 2007/0077717 A1* | 4/2007 | Kim | H01L 21/02145 |
| | | | 438/303 |
| 2009/0004867 A1* | 1/2009 | Yune | H01L 21/0337 |
| | | | 438/696 |
| 2009/0093120 A1 | 4/2009 | Hirota | |
| 2013/0084688 A1* | 4/2013 | O=Meara | H01L 21/0337 |
| | | | 438/478 |
| 2015/0235850 A1 | 8/2015 | Yaegashi | |
| 2015/0340240 A1* | 11/2015 | Tsai | H01L 21/76802 |
| | | | 438/696 |

OTHER PUBLICATIONS

Japan Patent Office, Office Action for related Japanese patent application No. 2017-079211, dated Mar. 27, 2018, 9 pages.
Japan Patent Office, Office Action for related Japanese patent application No. 2017-079211, dated Nov. 13, 2018, 5 pages.
Korean Intellectual Property Office, 2nd Office Action for related korean patent application No. 10-2017-0047511, dated Dec. 27, 2018, 10 pages.

* cited by examiner

SELF-ALIGNED SPACER FORMATION

CROSS-REFERENCE TO RELATED APPLICATIONS

This application is related to and claims priority to U.S. Provisional Patent Application Ser. No. 62/321,426 filed on Apr. 12, 2016, the entire contents of which are herein incorporated by reference.

FIELD OF THE INVENTION

This invention relates to a method of patterning a thin film on a substrate, and more particularly to a method of using a sacrificial film and conformal deposition to pattern a thin film on a substrate.

BACKGROUND OF THE INVENTION

In material processing methodologies, pattern etching comprises the application of a thin layer of a light-sensitive material, such as a photo-resist, to an upper surface of a substrate that is subsequently patterned in order to provide a mask for transferring this pattern to the underlying thin film during etching. The patterning of the light-sensitive material generally includes exposing the light-sensitive material to a radiation source through a reticle (and associated optics) using, for example, a photo-lithography sensitive system, and removing the irradiated regions of the light-sensitive material (as in the case of a positive photo-resist) or non-irradiated regions (as in the case of negative photo-resist) using a developing solvent. Moreover, this mask layer may comprise multiple sub-layers. Photo-lithographic methods are limited dimensionally by the wavelengths of light or electromagnetic radiation used to react with the photo-resist, and the corresponding optics required to manage the wavelengths of light.

More recently, double patterning technologies have been used to meet the increasing need to produce smaller features. There are two dominant methods for double patterning: (1) sidewall or spacer processes and (2) double lithography processes. In the spacer process, the spacer is used as the final mask to create the final pattern in the thin film. The spacer is generated in a multi-layer mask, wherein the mask layer may comprise a light-sensitive material, such as the photo-resist described above.

However, conventional methods have not yielded the desired high-profile features. There is thus a need for new methods for forming ultra-thin raised features on substrates and/or ultra-thin features formed in substrates.

SUMMARY OF THE INVENTION

The present invention provides methods for forming ultra-thin raised features on substrates and/or ultra-thin features formed in substrates. The methods provide a definition of features that is smaller than conventional photo-lithographic techniques for a hard mask feature as well as the spacing between the features, since both dimensions are defined by the thickness of the respective spacers. In that regard, and in accordance with one embodiment of the present invention, a method of patterning a substrate includes forming a sacrificial film over a substrate and creating a pattern therein.

According to one embodiment of the invention, a substrate processing method is provided, where the method includes forming a sacrificial film over a substrate, creating a pattern in the sacrificial film, conformally depositing a first spacer layer over the patterned sacrificial film, removing horizontal portions of the first spacer layer while substantially leaving vertical portions of the first spacer layer; and selectively depositing a second spacer layer on the first spacer layer.

According to another embodiment of the invention, the substrate processing method further includes removing the sacrificial film after selectively depositing the second spacer layer, thereby forming a pattern containing the first and second spacer layers.

According to yet another embodiment of the invention, the substrate processing method further includes removing the sacrificial film after selectively depositing the second spacer layer, removing the first spacer layer, thereby forming a pattern containing the second spacer layer.

According to still another embodiment of the invention, the substrate processing method further includes removing the sacrificial film before selectively depositing the second spacer.

According to another embodiment of the invention, the substrate processing method further includes removing the sacrificial film before selectively depositing the second spacer layer; and removing the first spacer layer, thereby forming a pattern containing the second spacer layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
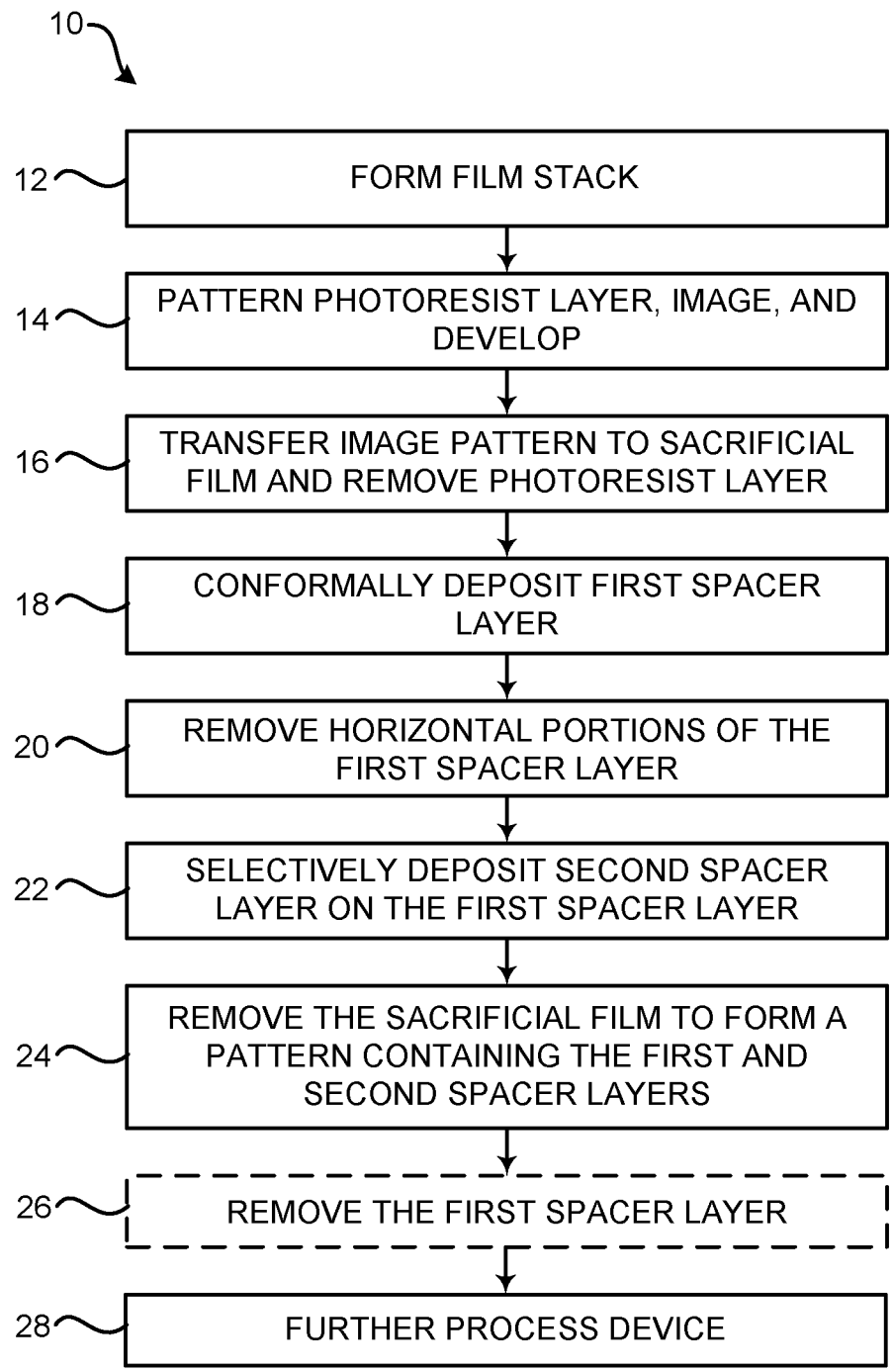
FIG. 1 is a flow chart illustrating a method of patterning a thin film on a substrate in accordance with embodiments of the present invention.
Figure 2A:
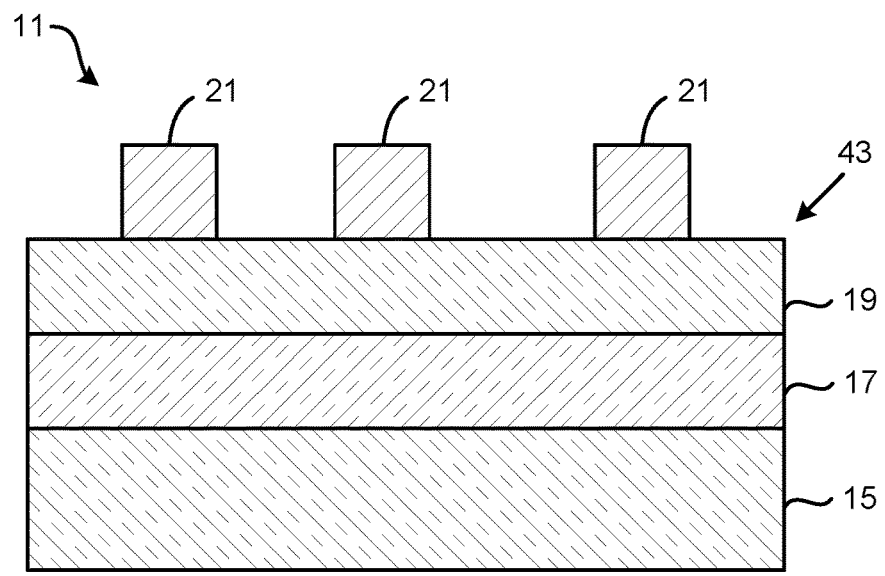
FIGS. 2A-2H illustrate, schematically, a method of patterning a thin film on a substrate in accordance one method embodiment of FIG. 1.

Turning now to the figures, and in particular to FIGS. 1 and 2A, a method 10 of patterning a structure in a thin film formed on a substrate for manufacturing a device 11 is described. That is, in 12, a lithographic structure comprising a film stack 43 is formed on a substrate 15. The film stack 43 includes a thin film 17 formed on the substrate 15, a sacrificial film 19 formed on the thin film 17, and a photo-resist layer 21 formed on the sacrificial film 19.

The thin film 17 may comprise a conductive layer, a non-conductive layer, or a semi-conductive layer. For instance, the thin film 17 may include at least one material layer comprising a silicon-containing material, such as poly-silicon, silicon dioxide, silicon nitride, silicon carbide, or silicon oxynitride, etc. The thin film 17 may comprise a low dielectric constant (i.e., low-k) or ultra-low dielectric constant (i.e., ultra-low-k) dielectric layer having a nominal dielectric constant value that is less than the dielectric constant of $SiO_2$, which is approximately 4 (e.g., the dielectric constant for thermal silicon dioxide ranges from about 3.8 to about 3.9). More specifically, the thin film 17 may have a dielectric constant ranging from about 1.6 to about 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organosiloxane), deposited using a chemical vapor deposition ("CVD") technique. Examples of such films include BLACK DIAMOND CVD organosilicate glass ("OSG") films, which are commercially-available from Applied Materials, Inc. (Santa Clara, Calif.), or CORAL CVD films, which are commercially-available from Novellus Systems, Inc. (San Jose, Calif.). Alternatively, these dielectric layers may include porous inorganic-organic hybrid films comprised of a single-phase, such as a silicon oxide-based matrix having $CH_3$ bonds that hinder full densification of the thin film 17 during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane ("HSQ") or methyl silsesquioxane ("MSQ"), deposited using a spin-on dielectric ("SOD") technique. Examples of such films include FOX HSQ, which is commercially-available from Dow Corning (Midland, Mich.), XLK porous HSQ, which is also commercially-available from Dow Corning, and JSR LKD-5109, which is commercially-available from JSR Microelectronics (Sunnyvale, Calif.). Still alternatively, these dielectric layers may comprise an organic material deposited using an SOD technique. Examples of such films include SILK-I, SILK-J, SILK-H, SILK-D, and porous SILK semiconductor dielectric resins that are commercially-available from Dow Chemical, and GX-3, and GX-3P semiconductor dielectric resins commercially available from Honeywell (Morristown, N.J.).

The thin film 17 may be formed using a vapor deposition technique, such as CVD, plasma enhanced CVD ("PECVD"), atomic layer deposition ("ALD"), plasma enhanced ALD ("PEALD"), physical vapor deposition ("PVD"), or ionized PVD ("iPVD"), or a spin-on technique, such as those offered in the Clean Track ACT 8 SOD (spin-on dielectric), ACT 12 SOD, and Lithius coating systems commercially available from Tokyo Electron Limited ("TEL")(Minato-ku, Tokyo). The Clean Track ACT 8 (200 mm), ACT 12 (300 mm), and Lithius (300 mm) coating systems provide coat, bake, and cure tools for SOD materials. The track system may be configured for processing substrates of varying sizes, include substrates having diameters of 100 mm, 200 mm, 300 mm, and greater. Other systems and methods for forming a thin film on a substrate are well known to those skilled in the art of both spin-on technology and vapor deposition technology.

The sacrificial film 19, formed on the thin film 17, may comprise an anti-reflective coating ("ARC") layer, e.g., a bottom ARC ("BARC"), and may optionally include additional layers not specifically shown herein. ARC layers possess anti-reflective properties that are suitable for use as an anti-reflective coating and that withstand degradation during a photo-resist removal step. Resistance to degradation during removal of the photo-resist allows for selective removal of the photo-resist using standard plasma ashing processes while leaving the sacrificial structure intact.

In some embodiments, the sacrificial film 19 may comprise a silicon-containing ARC layer, which enables double patterning of thin films by providing adequate mechanical properties for withstanding patterning processes, conformal deposition over ARC layer structures, and subsequent removal process(es). The sacrificial film 19 may further optionally include a hard mask layer or a planarization layer, such as an organic planarization layer ("OPL") disposed between the thin film 17 and the ARC layer. In some embodiments, the sacrificial film 19 may comprise polysilicon, silicon nitride, or silicon oxide.

Additionally, according to another embodiment of the invention, the ARC layer, when etched, has mechanical properties that are sufficient to withstand the stresses associated with the deposition of a first spacer layer. For example, the silicon-containing ARC material, described above, may be generally stronger than standard organic ARC materials and may provide better selectivity between the photo-resist and ARC layer. Hence, the silicon-containing ARC material will be better able to withstand the stripping/ashing plasma and the stress induced during deposition of a spacer layer, thereby allowing for better profile control. Suitable materials for use in the ARC layer include, for example, antireflective coatings containing silicon that are commercially available from Dow Corning, Brewer Science, Inc., JSR Corp., Rohm and Haas, and Shin Etsu Chemical Co., Ltd.

Alternatively, rather than a silicon-containing ARC layer, the sacrificial film 19 may include a multi-layer arrangement that includes one or more silicon compounds and one or more materials that have anti-reflective properties, such as amorphous carbon. The silicon compounds add strength and selectivity to the multiple sacrificial films.

The sacrificial film 19 may be applied and selectively removed by a wet-patterning process using a coating/developing system, though embodiments of the invention are not so limited. For example, in another embodiment, the sacrificial film 19 may be applied and selectively removed by a dry-patterning process comprising a coating/developing system in combination with a dry etch tool. In one embodiment, a thickness of the sacrificial film 19 may be between about 50 nanometers and about 100 nanometers. In another embodiment, the thickness of the sacrificial film 19 may be between about 20 nanometers and about 50 nanometers. In an alternative embodiment, the thickness of the sacrificial film 19 may be between about 100 nanometers and about 300 nanometers.

Still referring to FIG. 2A, the photo-resist layer 21 may comprise 248 nm (nanometer) resists, 193 nm resists, 157 nm resists, or EUV (extreme ultraviolet) resists. The photo-resist layer 21 may be formed using a track system, such as those tracks systems that were described previously. Other systems and methods for forming a photo-resist layer 21 on a substrate 15 are well known to those skilled in the art of spin-on resist technology. The coating of the photo-resist layer 21 may include any or all processes known to those skilled in the art of preparing such films including, but not limited to, performing a cleaning process prior to the coating process, performing a post-application bake ("PAB") following the coating process, etc.

An optional hardmask layer (not shown) may be included and comprise a silicon oxide ($SiO_x$), a silicon nitride ($SiN_x$), a silicon carbide ($SiC_x$), a silicon oxynitride ($SiO_xN_y$), a silicon carbonitride ($SiC_xN_y$), or an amorphous carbon, or any combination of two or more thereof. These materials may be deposited using a CVD process.

An optional planarization layer (not shown) may include an OPL comprised of a photo-sensitive organic polymer or an etch type organic compound, but is not so limited. For instance, the photo-sensitive organic polymer may be polyacrylate resin, epoxy resin, phenol resin, polyamide resin, polyimide resin, unsaturated polyester resin, polyphenylether resin, polyphenylenesulfide resin, or benzocyclobutene ("BCB"). These materials may be formed using spin-on techniques.

Still referring to FIG. 1 and FIG. 2A, in 14, an image pattern is created in the photo-resist layer 21 using standard photolithographic techniques, as known to those of ordinary skill in the art. For example, the photo-resist layer 21 may be exposed to electromagnetic radiation, through a reticle in a dry or wet photo-lithography system (not shown), to create an image of the pattern using any suitable conventional stepping lithographic system, or scanning lithographic system. For example, the photo-lithographic system may be commercially-available from ASML Netherlands B.V. (Veldhoven, The Netherlands), or Canon USA, Inc., Semiconductor Equipment Division (San Jose, Calif.). The photo-resist layer 21 is then developed to form the image pattern using a developing solvent in a developing system, such as the track systems described above, to remove the imaged (irradiated) portions. The developing of the photo-resist layer 21 may include any or all processes known to those skilled in the art of preparing such films including, but not limited to, performing a post-exposure bake ("PEB") prior to the developing process, performing a hard bake following the developing process, etc.

Figure 2B:
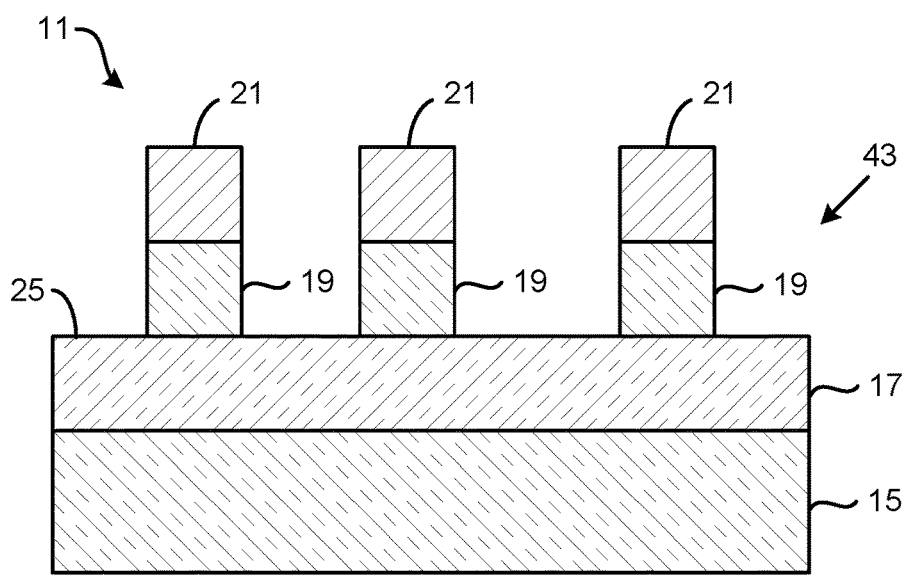

With the photo-resist layer 21 developed, and now with reference to FIGS. 1 and 2B, in 16, the image pattern developed in the photo-resist layer 21 is transferred to the underlying sacrificial film 19, in this case the ARC layer, using an etching or stripping process. The etching process may include any combination of wet or dry etching processes as are known to those having ordinary skill in the art. The dry etching processes may include dry plasma etching processes or dry non-plasma etching processes or combinations thereof. For example, fluoro-carbon chemistry or halogen-containing chemistry may be used to etch the sacrificial film 19. Additionally, for example, a $C_xF_y$-based process chemistry, or a $C_xF_yH_z$-based process chemistry, or both may be used to etch the sacrificial film 19. More specifically, and in accordance with one embodiment, $CH_2F_2$ and $CHF_3$ may be used to etch a silicon-containing sacrificial film 19. Still further, a $SF_6$-based chemistry may be used to etch the sacrificial film 19.

Figure 2C:
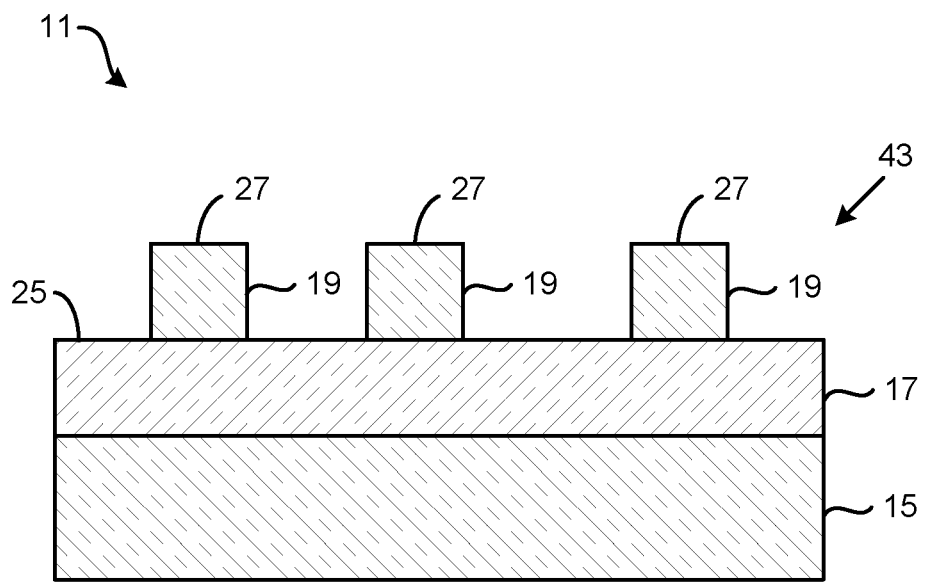

Also in 16, the photo-resist layer 21 is removed from the sacrificial film 19, as shown in FIG. 2C. If so desired, the sacrificial film 19 may be trimmed using an etching process. For example, a plasma oxygen or fluorocarbon chemistry may be used to trim the sacrificial film 19 to a width that may be comparable to the final pitch of the multi-layer pattern.

Figure 2D:
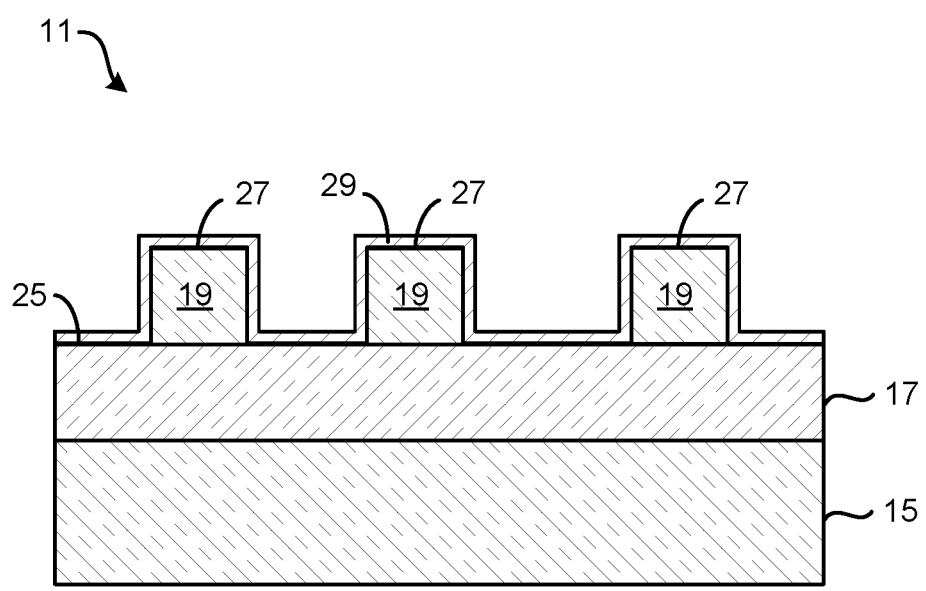

Referring now to FIGS. 1 and 2D, in 18, a first spacer layer 29 is conformally formed on the sacrificial film 19. The technique of conformally depositing the first spacer layer 29 may include a monolayer deposition ("MLD") method. The MLD method may include, for example, an ALD method, which is based on the principle of the formation of a saturated monolayer of reactive precursor molecules by chemisorption. A typical MLD process for forming an AB film, for example, consists of injecting a first precursor or reactant A ("$R_A$") for a period of time in which a saturated monolayer of A is formed on the substrate. Then, $R_A$ is purged from the chamber using an inert gas, $G_i$. A second precursor or reactant B ("$R_B$") is then injected into the chamber, also for a period of time, to combine B with A and form the layer AB on the substrate. $R_B$ is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom. In some embodiments, the first spacer layer 29 may contain silicon dioxide, silicon nitride, or a high-k material (e.g., hafnium oxide, hafnium silicate, zirconium oxide, etc.).

In some embodiments, the MLD process when forming an AB film may include injecting a precursor containing ABC, which is adsorbed on the substrate during the first step, and then removing C during the second step. In accordance with some embodiments of the invention, the first spacer layer 29 may comprise metal-containing layer. Examples of metal-containing layers include layers that contain aluminum (Al), titanium (Ti), or both aluminum and titanium. According to one embodiment, the metal-containing layer is selected from the group consisting of Al, $Al_2O_3$, AlN, AlON, an Al-containing precursor, Ti, $TiO_2$, TiON, TiN, a Ti-containing precursor, and combinations thereof Embodiments of the invention may utilize a wide variety of Al-containing precursors. For example, many aluminum precursors have the formula:

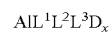

$AlL^1L^2L^3D_x$ where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, □-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(^tBu)_3$, $Al(^iBu)_2H$, $AlEt_2Cl$, $Et_3Al_2(O^sBu)_3$, and $Al(THD)_3$.

Embodiments of the invention may utilize a wide variety of Ti-containing precursors. Examples include Ti-containing precursors having "Ti-N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta^5-C_5H_5)_2Cl$, $Ti(\eta^5-C_5H_5)_2Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5$ $(CH_3)_5)_2(H)_2$, and $Ti(CH_3)_2(\eta^5-C_5(CH_3)_5)_2$. $TiCl_4$ is an example of a titanium halide precursor containing a "Ti-halogen" bond.

Figure 7:
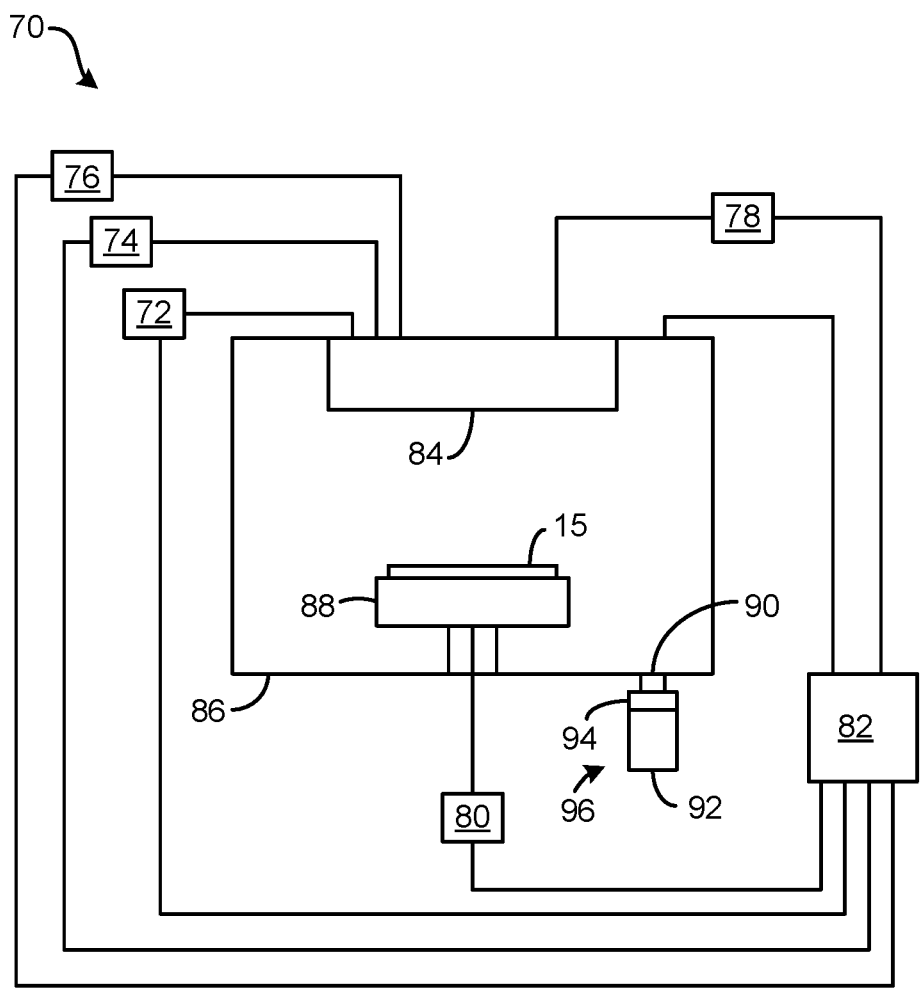
FIG. 7 is a schematic view of an Atomic Layer Deposition system for use with one or more embodiments of the present invention.

According to one embodiment, the first spacer layer 29 may be deposited by an ALD deposition process in an ALD system 70, one example of which is shown in FIG. 7, which includes a process chamber 86 having a substrate holder 88 configured to support the substrate 15 thereon. The process chamber 86 further contains an upper assembly 84 (for example, a shower head) coupled to a first process material supply system 72, a second process material supply system 74, a purge gas supply system 76, and one or more auxiliary gas supply systems 78 (which may include an oxygen-containing gas, a nitrogen-containing gas, or other as necessary for depositing the desired spacer layer material), and a substrate temperature control system 80.

Alternatively, or in addition, a controller 82 may be coupled to one or more additional controllers/computers (not shown), which may obtain setup and/or configuration information from the additional controllers/computers. The controller 82 may be used to configure any number of the processing elements 72, 74, 76, 78, 80, and may collect, provide, process, store, and/or display data from the same. The controller 82 may comprise a number of applications for controlling one or more of the processing elements 72, 74, 76, 78, 80, and may, if desired, include a graphical user interface ("GUI," not shown) that may provide an easy to use interface for a user to monitor and/or control one or more of the processing elements 72, 74, 76, 78, 80.

The process chamber 86 is further coupled to a pressure control system 96, including a vacuum pumping system 92 and a valve 94, through a duct 90, wherein the pressure control system 96 is configured to controllably evacuate the process chamber 86 to a pressure suitable for forming the first spacer layer 29 (FIG. 2D) and suitable for use of the first and second process materials. The pressure control system 96 may include a turbo-molecular vacuum pump ("TMP") or a cryogenic pump that is capable of a pumping speed up to about 5000 liters per second (and greater) and the valve 94 may include a gate valve for throttling the chamber pressure. Moreover, a device (not shown) for monitoring the chamber process may be coupled to the process chamber 86, which may include, for example, a Type 628B Baratron absolute capacitance manometer, which is commercially-available from MKS Instruments, Inc. (Andover, Mass.). The pressure control system 96 may, for example, be configured to control the process chamber pressure between about 0.1 Torr and about 100 Torr during an ALD process.

The first and second material supply systems 72, 74, the purge gas supply system 76, and each of the one or more auxiliary gas supply systems 78 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. According to embodiments of the invention, gases may be sequentially and alternately pulsed into the process chamber 86, where the length of each gas pulse may, for example, be between about 0.1 second and about 100 seconds. Alternately, the length of each gas pulse may be between about 1 second and about 10 seconds. Exemplary gas pulse lengths for oxygen- and nitrogen-containing gases may be between about 0.3 second and about 3 seconds, for example, about 1 second. Exemplary purge gas pulses may be between about 1 second and about 20 seconds, for example, about 3 seconds. An exemplary pulsed gas injection system is described in greater detail in U.S. Application Publication No. 2004/0123803.

Still referring to FIG. 7, the controller 82 may comprise a microprocessor, memory, and a digital I/O port capable of generating control voltages sufficient to communicate and activate inputs to the ALD system 70, as well as monitor outputs from the ALD system 70. Moreover, the controller 82 may be coupled to and may exchange information with the process chamber 86, the substrate holder 88, the upper assembly 84, the processing elements 72, 74, 76, 78, the substrate temperature control system 80, and the pressure control system 96. For example, a program stored in a memory of the controller 82 may be utilized to activate the inputs to the aforementioned components of the ALD system 70 according to a process recipe in order to perform a deposition process. One example of the controller 82 is a DELL PRECISION WORKSTATION 610™, commercially-available from Dell Corp., (Austin, Tex.).

However, the controller 82 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 82 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 82, for driving a device or devices for implementing the present invention, and/or for enabling the controller 82 to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 82 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 82 for execution. For example, the instructions may initially be carried on a magnetic disk of a remote computer. The remote computer can load the instructions for implementing all or a portion of the present invention remotely into a dynamic memory and send the instructions over a network to the controller 82.

The controller 82 may be locally located relative to the ALD system 70, or it may be remotely located relative to the ALD system 70. For example, the controller 82 may exchange data with the ALD system 70 using at least one of a direct connection, an intranet, the Internet and a wireless connection. The controller 82 may be coupled to an intranet at, for example, a customer site (i.e., a device maker, etc.), or it may be coupled to an intranet at, for example, a vendor site (i.e., an equipment manufacturer). Additionally, for example, the controller 82 may be coupled to the Internet. Furthermore, another computer (i.e., controller, server, etc.) may access, for example, the controller 82 to exchange data via at least one of a direct connection, an intranet, and the Internet. As also would be appreciated by those skilled in the art, the controller 82 may exchange data with the ALD system 70 via a wireless connection.

Returning again to FIG. 2D, deposition of the first spacer layer 29, and in particular, a metal-containing spacer layer, may proceed by sequential and alternating pulse sequences to deposit the different components (here, for example, a metal and oxygen) of the first spacer layer material. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the process chamber 86. According to other embodiments of the present invention, one or more of the purge or evacuation steps may be omitted.

Therefore, and as one exemplary embodiment, the substrate 15 with the processed sacrificial film 19 is disposed in the process chamber 86 of the ALD system 70 and sequentially exposed to a gas pulse containing a metal and a gas pulse of an oxygen-containing gas, the latter of which may include $O_2$, $H_2O$, $H_2O_2$, ozone, plasma-exited oxygen (such as for use in PEALD systems), or a combination thereof, and optionally an inert gas, such as argon (Ar).

The metal may react on the surface of the sacrificial film 19 to form a chemisorbed layer that is less than a monolayer thick. The oxygen from the gas pulse of the oxygen-containing gas may then react with the chemisorbed surface layer. By repeating this sequential gas exposure, i.e., by alternating the two exposures a plurality of times, it is possible to achieve layer-by-layer growth of about 1 angstrom ($10^{-10}$ meter) per cycle until a desired thickness is achieved.

Figure 2E:
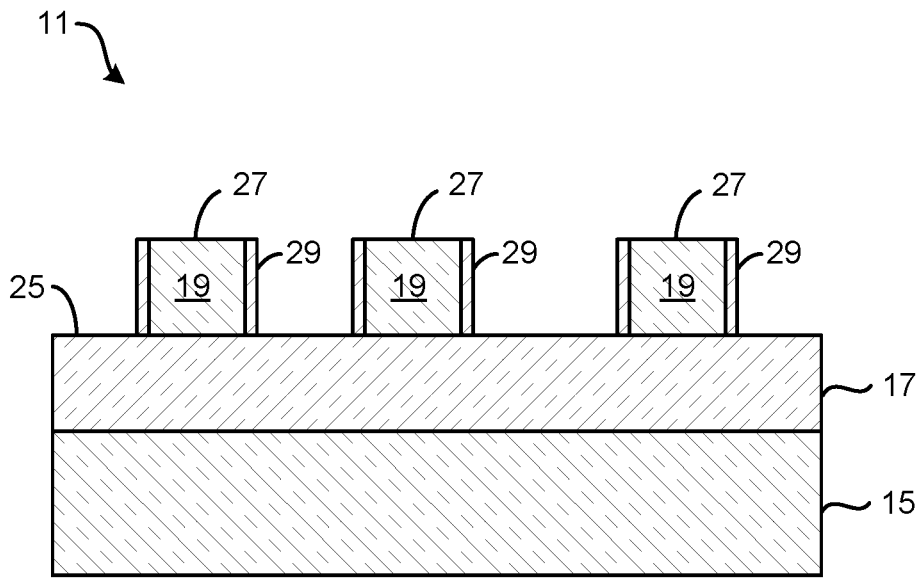

Still referring to FIG. 2D, and now also with reference to FIG. 2E, with the first spacer layer deposition complete, in 20, a partial spacer etch process may be used to remove one or more horizontal surfaces of the deposited first spacer layer 29. More specifically, and as shown in FIG. 2E, the first spacer layer material deposited on the horizontal surface 27 of the sacrificial film 19 and the horizontal surface 25 of the thin film 17 is removed, such as by an etching process, while substantially leaving vertical portions of the first spacer layer 29. The removal process may include dry plasma etching, dry non-plasma etching, or combinations thereof. More specifically, the first spacer layer 29 may be etched using fluorocarbon chemistry or fluoro-hydrocarbon chemistry, or both. Alternatively, only the first spacer layer material deposited on the horizontal surface 27 of the sacrificial film 19 may be removed, such as by a planarization technique. The vertical portions of the first spacer layer 29 may have an aspect ratio ranging from about 1 to about 100. The aspect ratio may depend on the material used and the type of device being manufactured.

Figure 2F:
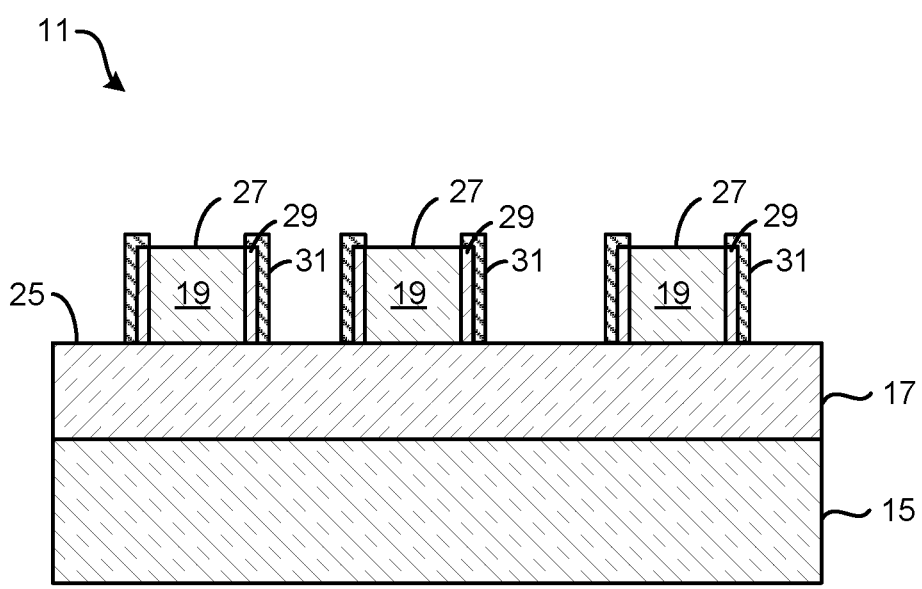

In 22, as illustrated in FIGS. 2F, a second spacer layer 31 is selectively deposited on the first spacer layer 29. According to some embodiments, the first spacer layer 29 comprises a metal-containing layer that catalyzes the selective deposition of the second spacer layer 31 on the first spacer layer 29. According to one embodiment, the second spacer layer 31 may contain a $SiO_2$ layer, and the first spacer layer may contain $Al_2O_3$ or an adsorbed Al-containing precursor (e.g., $AlMe_3$). In one example, a $SiO_2$ layer may be deposited using a silanol gas phase exposure. In some examples, the silanol gas may contain tris(tert-pentoxy) silanol, tris(tert-butoxy) silanol, or bis(tert-butoxy)(isopropoxy) silanol.

The deposition of the second spacer layer 31 may be carried out in a manner as described above for deposition of the first spacer layer 29. More specifically, sequential and alternating pulse sequences may be used to deposit the different components (here, for example, silicon and oxygen) of the second spacer layer material. The sequential and alternating deposition continues until a desired thickness is achieved. According to embodiments of the invention, due to the selective deposition of the second spacer layer 31 on the first spacer layer 29, a partial spacer etch process as described above for the first spacer layer 29 is not required. That is, the second spacer layer material is not deposited on the horizontal surface 27 of the sacrificial film 19 and is not deposited on the horizontal surface 25 of the thin film 17. This advantageously reduces the number of processing steps needed for processing the device 11. The horizontal thickness of the second spacer layer 31 may be between 1 nm and 10 nm, between 2 nm and 5 nm, between 2 nm and 7 nm, or between 5 nm and 10 nm. In one embodiment, the horizontal thickness of the second spacer layer 31 may be about 3 nm.

$SiO_2$ deposition experiments were performed using tris (tert-pentoxy) silanol. Exemplary deposition conditions included substrate temperature of 150° C., silanol pulse durations of 60 seconds, and purge gas pulse durations of 30 seconds. The resulting $SiO_2$ films were of good quality with a refractive index close to that of thermal oxide, fused silica, and TEOS CVD. Selective $SiO_2$ deposition was observed on $Al_2O_3$ layers and substrates with adsorbed $AlMe_3$ precursors. This demonstrates the catalytic effect of aluminum on $SiO_2$ deposition using a silanol precursor. This catalytic effect was observed until the $SiO_2$ films were about 3 nm thick, thereafter the $SiO_2$ deposition stopped. Additional $SiO_2$ film deposition of about 3 nm using silanol exposure could be achieved by first depositing a thin $Al_2O_3$ layer or absorbing an $AlMe_3$ precursor on the deposited $SiO_2$ film. These alternating steps could be repeated as needed to deposit a thick $SiO_2$ film.

Figure 2G:
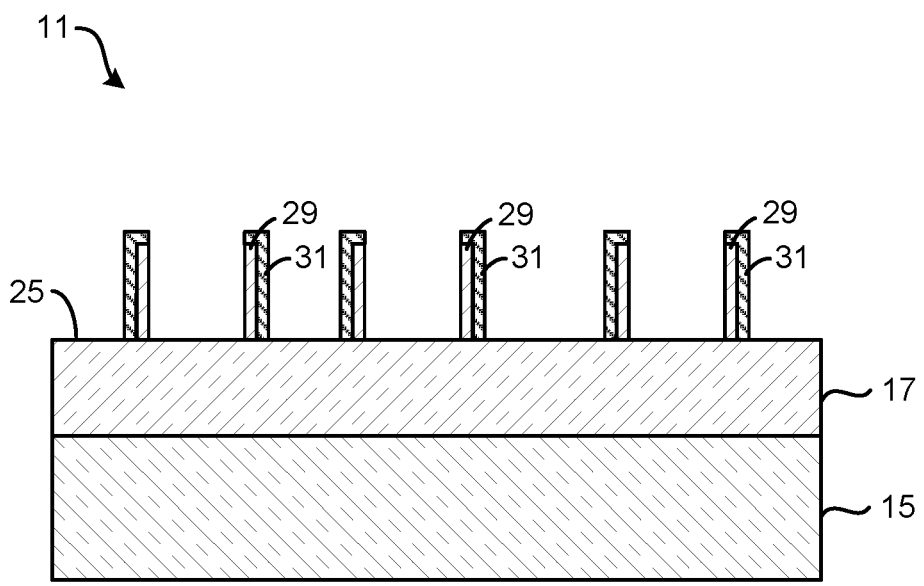

Referring now to FIG. 2G, in 24, the sacrificial film 19 is removed to form a pattern containing the first spacer layer 29 and the second spacer layer 31. The sacrificial film 19 is not overlaid by a spacer layer material and can, for example, be removed by an etching process. For example, the etching process may include any combination of wet or dry etching processes, as are known to those of ordinary skill in the art. The dry etching processes may include dry plasma etching processes, dry non-plasma etching processes, or combinations thereof. For example, fluorocarbon chemistry or halogen-containing chemistry may be used to etch the remaining sacrificial film material. Additionally, for example, a $C_xF_y$-based process chemistry, or a $C_xF_yH_z$-based process chemistry, or both may be used. Additionally yet, for example, $CH_2F_2$ and $CHF_3$ may be used to etch the remaining sacrificial film material. Further, a $SF_6$-based chemistry may be used to etch the remaining sacrificial film material.

In 26, the method 10 allows for optionally removing the first spacer layer 29 from the device 11. This embodiment of the invention is described in FIGS. 3A-3D.

Figure 2H:
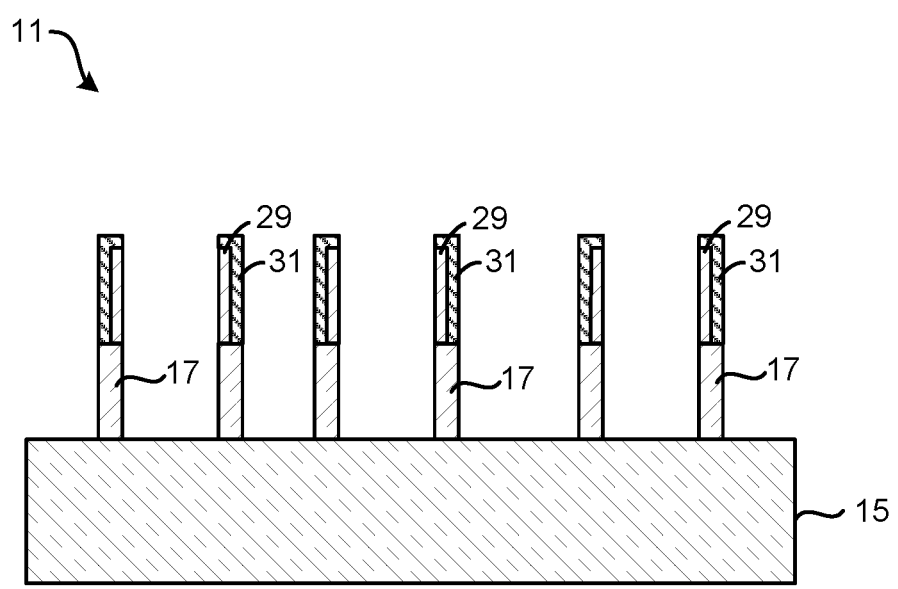

If the first spacer layer 29 is not removed in 26, the pattern structure in FIG. 2G may be used to further process the device 11 in 28. In one exemplary embodiment of the present invention, and as shown in FIG. 2H, the vertical portions of the first and second spacer layers 29, 31 may be used as a mask to transfer the image pattern to at least a portion of the underlying layers. Specially, the thin film 17 and, if desired, the substrate 14, may be etched. This is schematically shown in FIG. 2H. Additional or alternative processes may then ensue.

FIGS. 3A-3D illustrate, schematically, a method of patterning a thin film on a substrate in accordance with another method embodiment of FIG. 1. The device 11 in FIG. 2G is reproduced as device 13 in FIG. 3A. Steps 12-24 have been described above in reference to FIG. 1 and FIGS. 2A-2G.

Figure 3A:
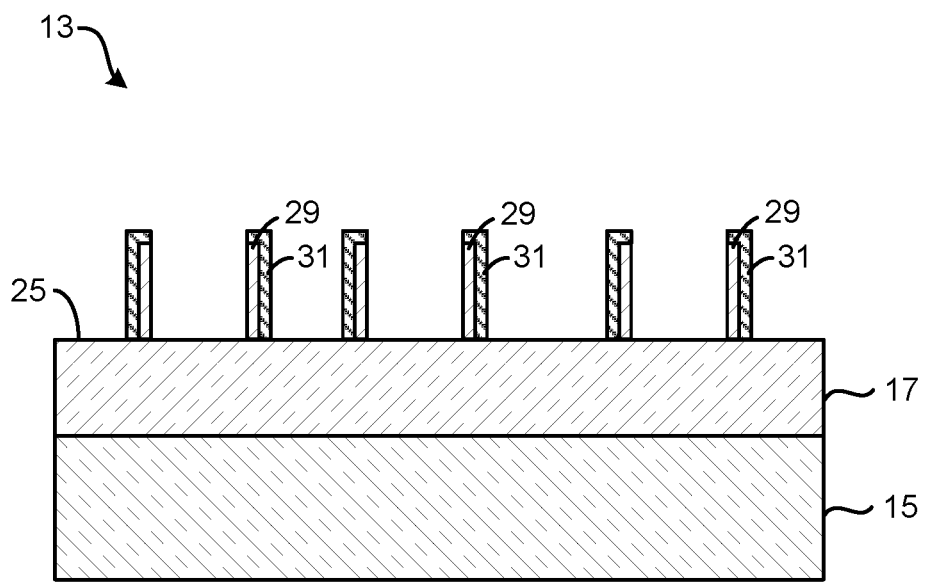
FIGS. 3A-3D illustrate, schematically, a method of patterning a thin film on a substrate in accordance with another method embodiment of FIG. 1.
Figure 3B:
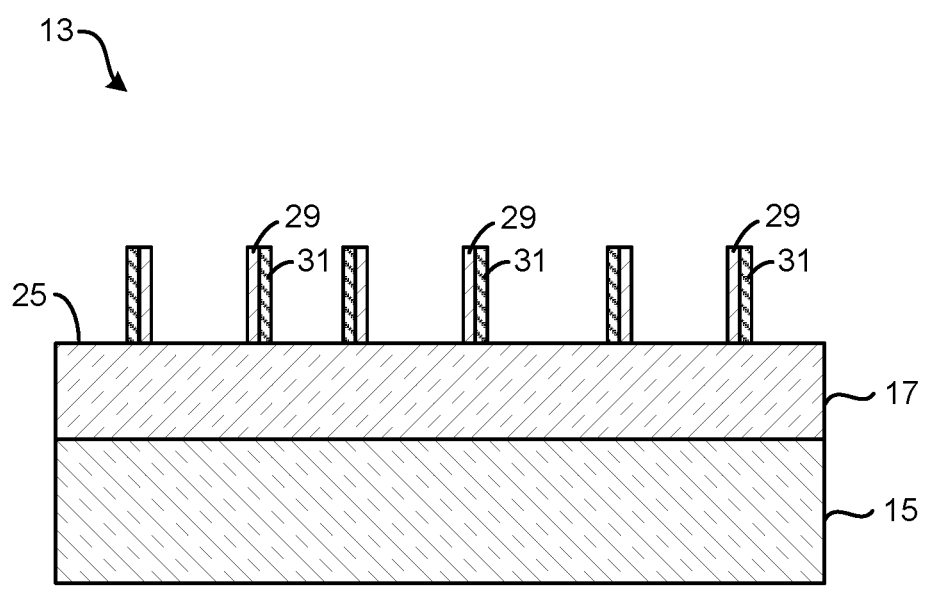
Figure 3C:
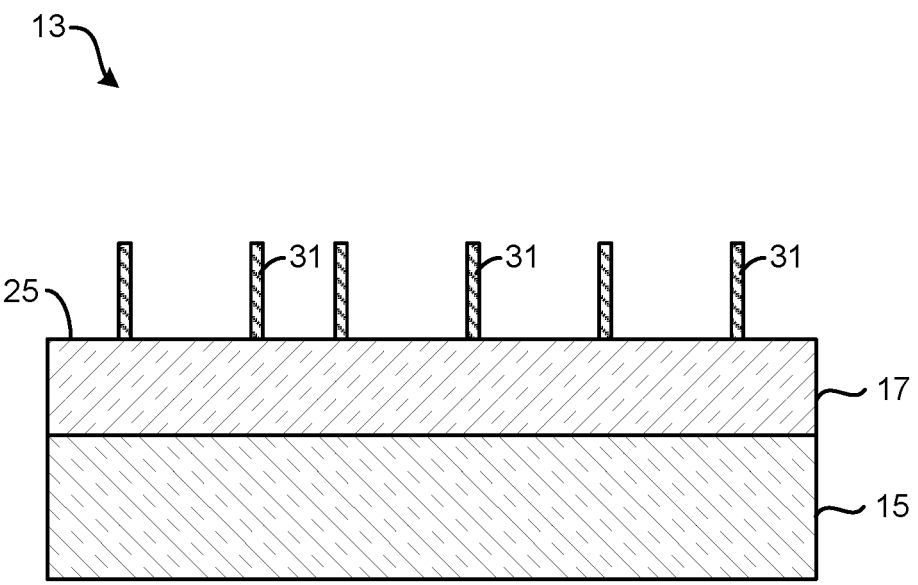

Referring now to FIGS. 3A-3C, in 26, the first spacer layer 29 is removed. The method includes removing horizontal portions of the second spacer layer 31 over a top surface of the first spacer layer 29 to expose the first spacer layer 29, and thereafter removing the first spacer layer 29 from the thin film 17. The top portion of the second spacer layer 31 may be removed using dry plasma etching processes, for example. For example, fluoro-carbon chemistry or halogen-containing chemistry may be used. Additionally, for example, a $C_xF_y$-based process chemistry, or a $C_xF_yH_z$-based process chemistry, or both may be used.

Figure 3D:
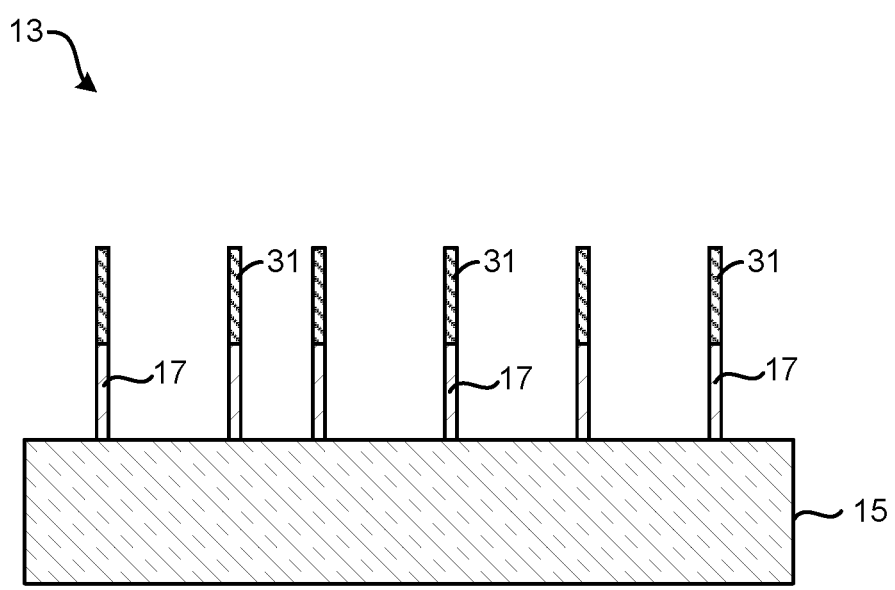

Thereafter, the first spacer layer 29 may be removed by an etching process. For example, the etching process may include any combination of wet or dry etching processes, as are known to those of ordinary skill the art. The remaining second spacer layer 31 shown in FIG. 3C may be used to further process the device 13. In one exemplary embodiment of the present invention, and as shown in FIG. 3D, the vertical portions of the second spacer layer 31 may be used as a mask to transfer the image pattern to at least a portion of the underlying layers. Specially, the thin film 17 and, if desired, the substrate 15, may be etched. Additional or alternative processes may then ensue.

Figure 4:
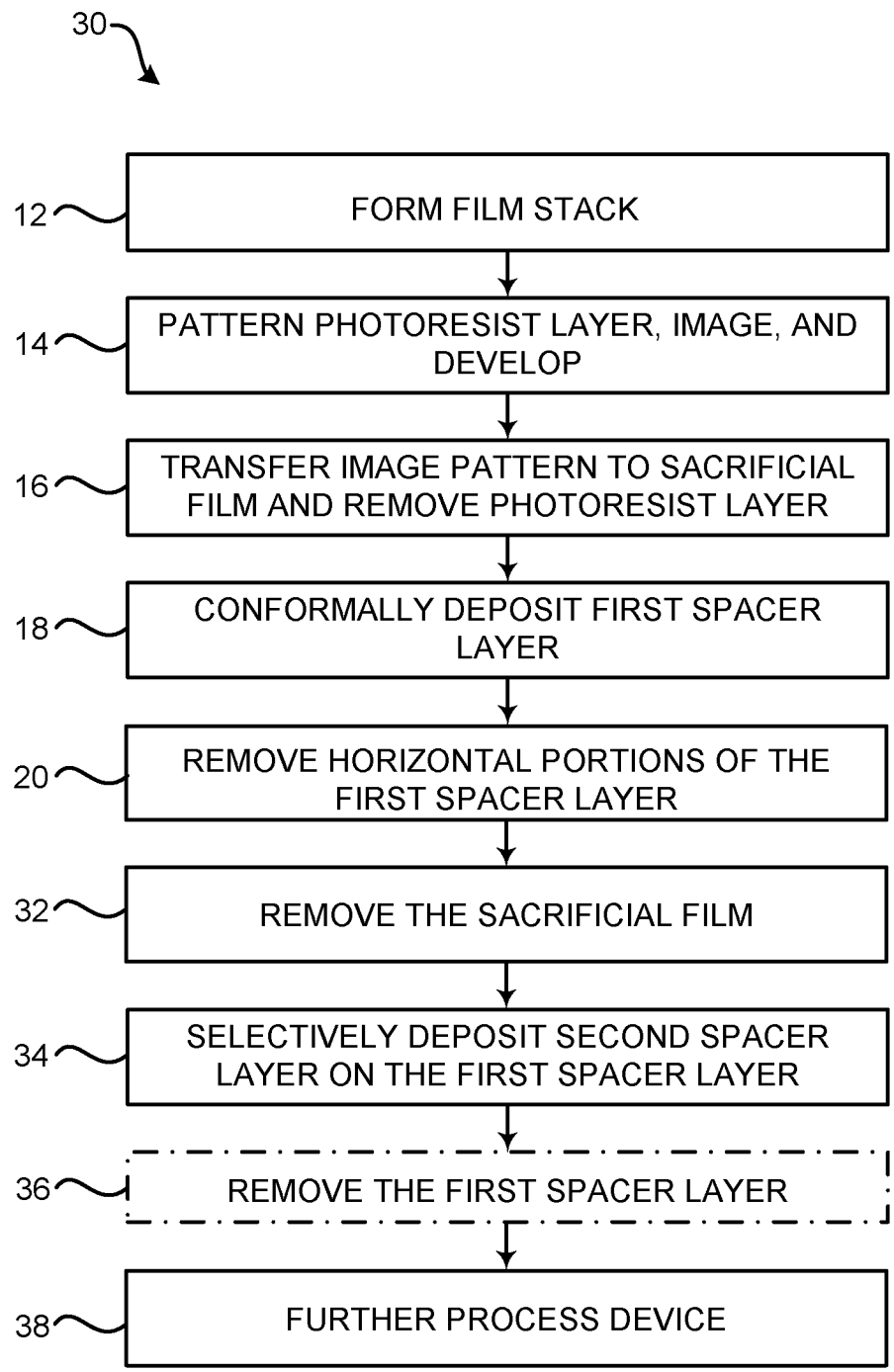
FIG. 4 is a flow chart illustrating a method of patterning a thin film on a substrate in accordance with embodiments of the present invention.

FIG. 4 is a flow chart illustrating a method of patterning a thin film on a substrate in accordance with embodiments of the present invention, and FIGS. 5A-5D illustrate, schematically, a method of patterning a thin film on a substrate in accordance with one method embodiment of FIG. 4.

Turning now to FIGS. 1 and 5A-5D, a method 30 of patterning a structure in a thin film formed on a substrate for manufacturing a device 23 is described. The device 23 in FIG. 2E has been reproduced as device 23 in FIG. 5A. Steps 12-20 of the method 30 have been described above in reference to FIG. 1 and FIGS. 2A-2E.

The method 30 further includes, in 32, removing the sacrificial film 19 to form a pattern containing the first spacer layer 29. The sacrificial film 19 is not overlaid by a spacer layer material and can, for example, be removed by an etching process. For example, the etching process may include any combination of wet or dry etching processes, as are known to those of ordinary skill the art. The dry etching processes may include dry plasma etching processes, dry non-plasma etching processes, or combinations thereof. For example, fluorocarbon chemistry or halogen-containing chemistry may be used to etch the remaining sacrificial film material. Additionally, for example, a $C_xF_y$-based process chemistry, or a $C_xF_yH_z$-based process chemistry, or both may be used. Additionally yet, for example, $CH_2F_2$ and $CHF_3$ may be used to etch the remaining sacrificial film material. Further, a $SF_6$-based chemistry may be used to etch the remaining sacrificial film material.

Figure 5A:
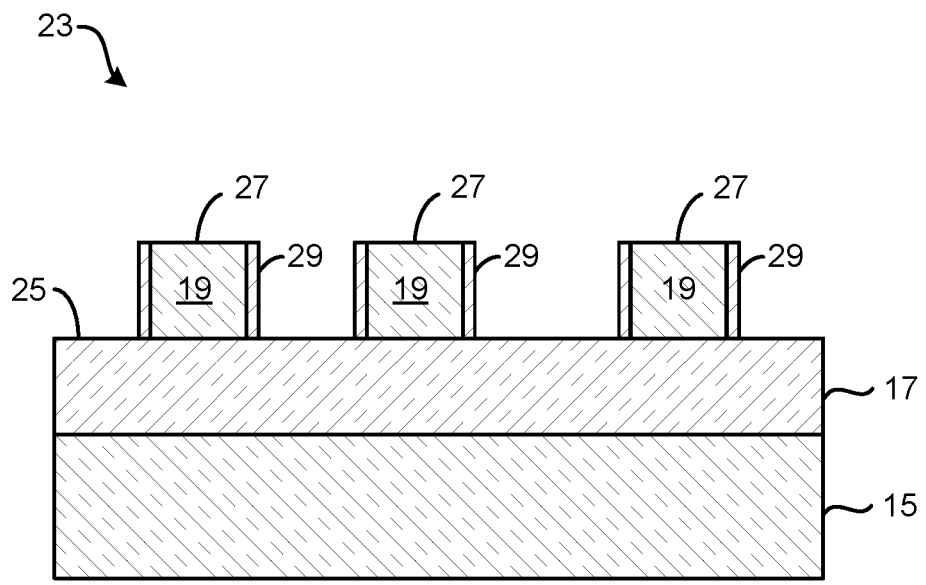
FIGS. 5A-5D illustrate, schematically, a method of patterning a thin film on a substrate in accordance with one method embodiment of FIG. 4.
Figure 5B:
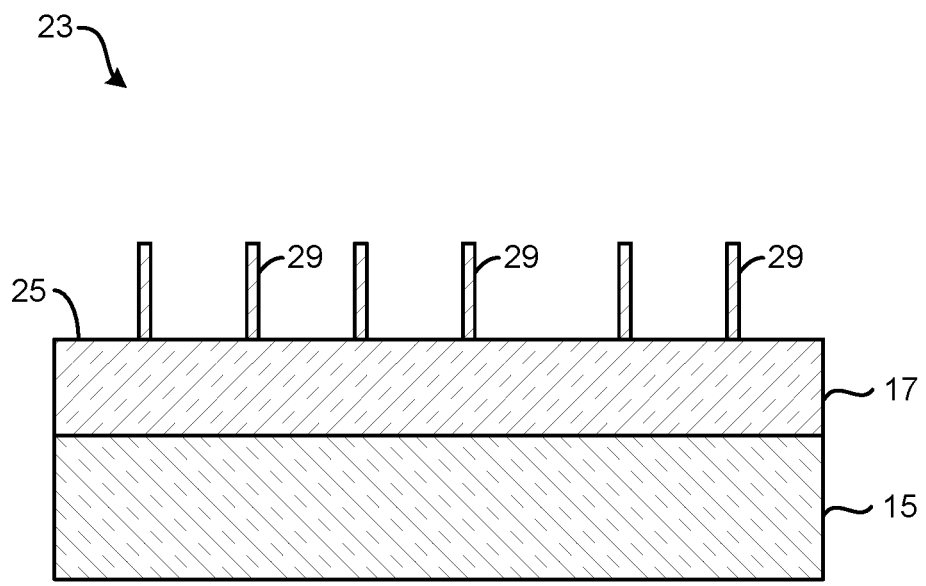
Figure 5C:
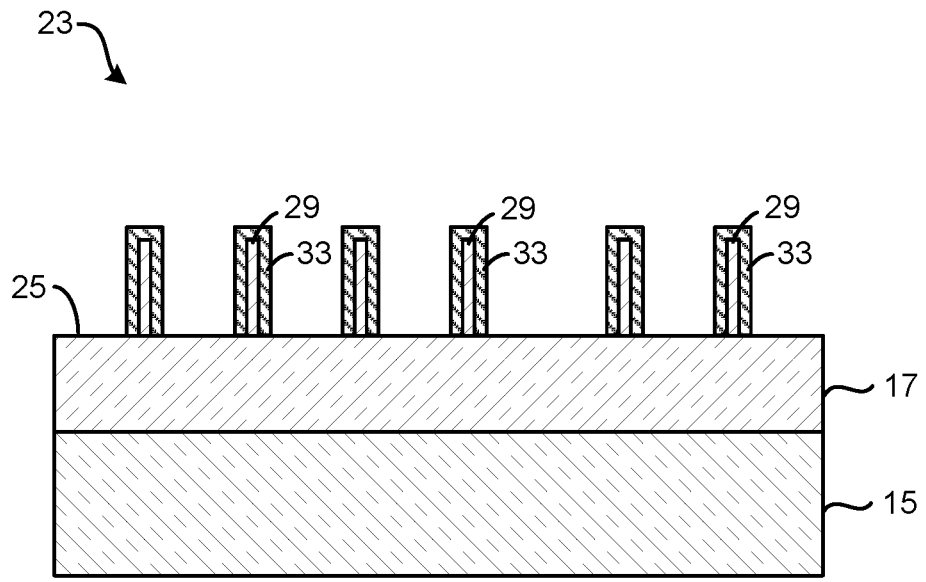

In 34, as illustrated in FIGS. 5C, a second spacer layer 33 is selectively deposited on the first spacer layer 29. According to one embodiment, the second spacer layer 33 may contain a $SiO_2$ layer. In one example, a $SiO_2$ layer may be deposited using a silanol gas phase exposure. The deposition of the second spacer layer 33 may be carried out in a manner as described above for deposition of the second spacer layer 31. More specifically, sequential and alternating pulse sequences may be used to deposit the different components (here, for example, silicon and oxygen) of the second spacer layer material. The sequential and alternating deposition continues until a desired thickness is achieved. According to embodiments of the invention, due to the selective deposition of the second spacer layer 33 on the first spacer layer 29, a partial spacer etch process as described above for the first spacer layer 29 is not required. That is, the second spacer layer material is not deposited on the horizontal surface 25 of the thin film 17. The horizontal thickness of the second spacer layer 33 may be between 1 nm and 10 nm, between 2 nm and 5 nm, between 2 nm and 7 nm, or between 5 nm and 10 nm. In one embodiment, the horizontal thickness of the second spacer layer 33 may be about 3 nm.

Figure 5D:
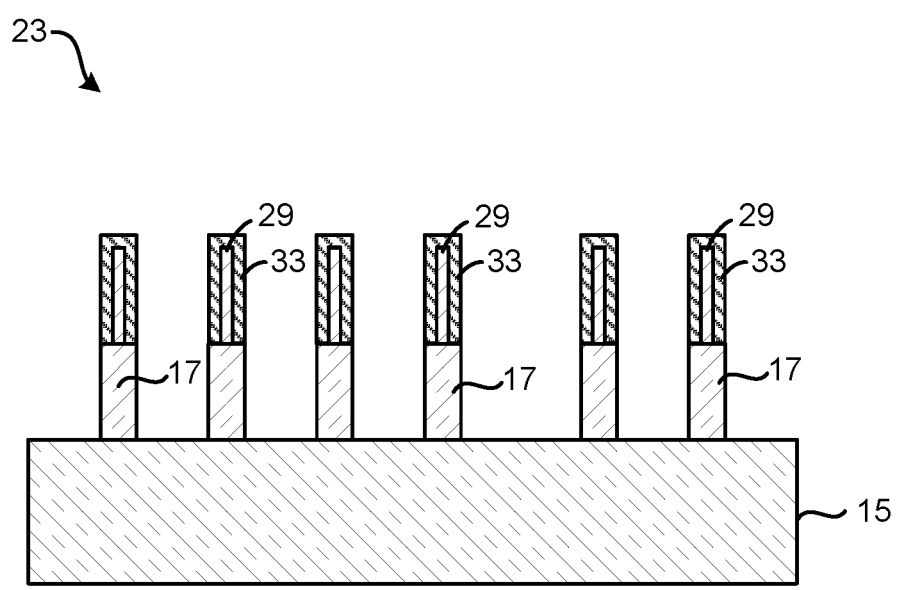

In 36, the first spacer layer 29 may optionally be removed. This embodiment of the invention is described in FIGS. 6A-6D. If the removal of the first spacer layer 29 is not performed, the pattern structure in FIG. 5C may be used to further process the device 23. In one exemplary embodiment of the present invention, and as shown in FIG. 5D, the vertical portions of the first and second spacer layers 29, 33 may be used as a mask to transfer the image pattern to at least a portion of the underlying layers. Specially, the thin film 17 and, if desired, the substrate 15, may be etched. Additional or alternative processes may then ensue.

FIGS. 6A-6D illustrate, schematically, a method of patterning a thin film on a substrate in accordance with another method embodiment of FIG. 4. The device 23 in FIG. 5C has been reproduced as device 35 in FIG. 6A. Steps 12-20 and 32-34 have been described above in reference to FIGS. 1, FIGS. 2A-2E, and FIGS. 5A-5C.

Figure 6A:
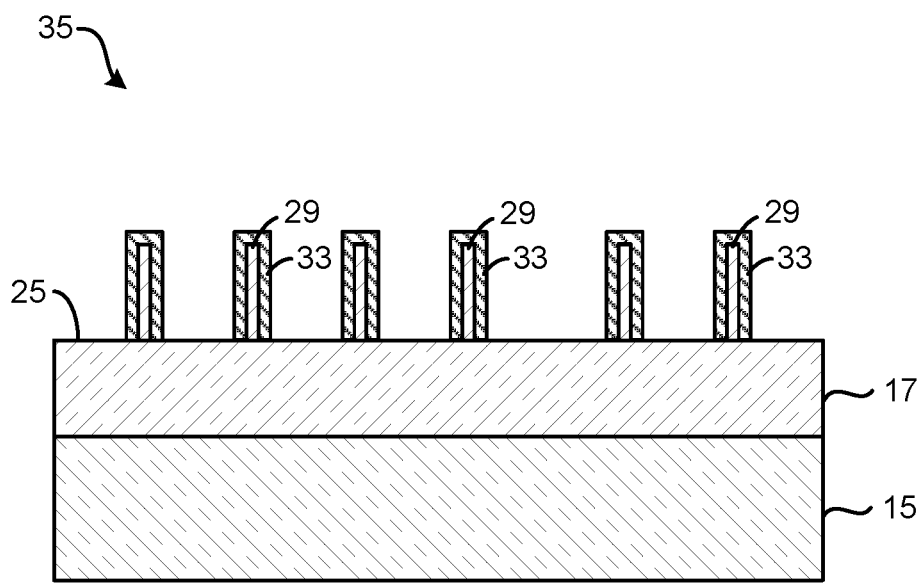
FIGS. 6A-6D illustrate, schematically, a method of patterning a thin film on a substrate in accordance with another method embodiment of FIG. 4.
Figure 6B:
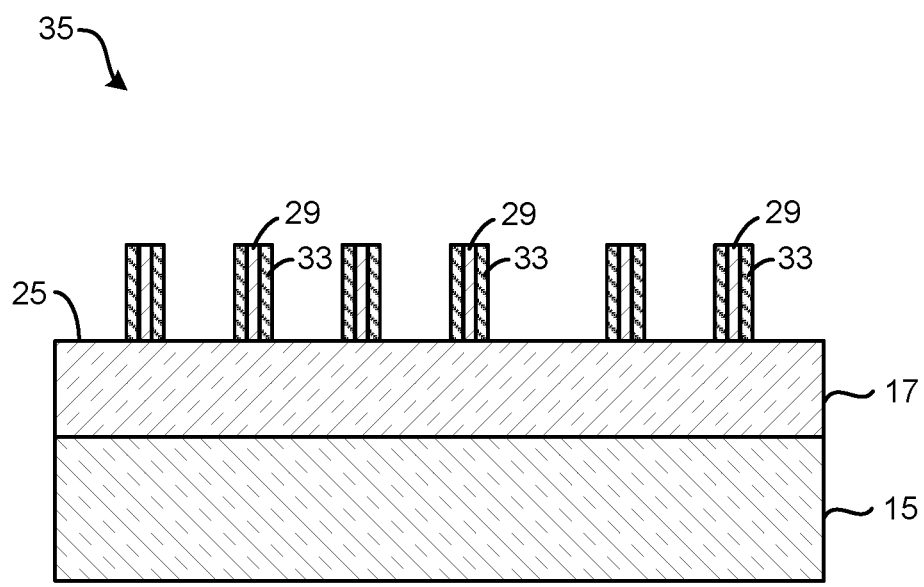
Figure 6C:
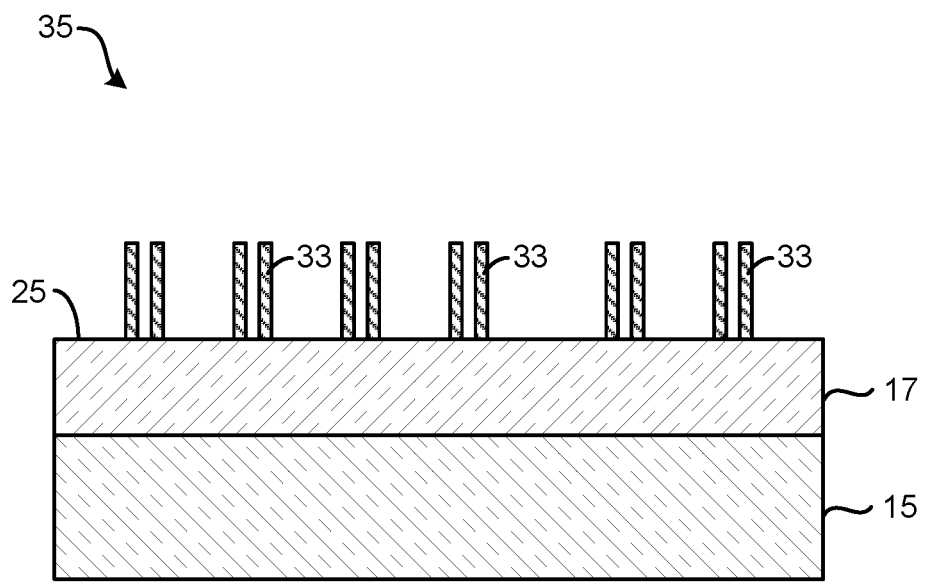

Referring now to FIGS. 6A-6C, in 36, the first spacer layer 29 is removed. The method includes removing horizontal portions of the second spacer layer 33 over a top surface of the first spacer layer 29 to expose the first spacer layer 29, and thereafter removing the first spacer layer 29 from the thin film 17. The first spacer layer 29 may be removed by an etching process. For example, the etching process may include any combination of wet or dry etching processes, as are known to those of ordinary skill the art.

Figure 6D:
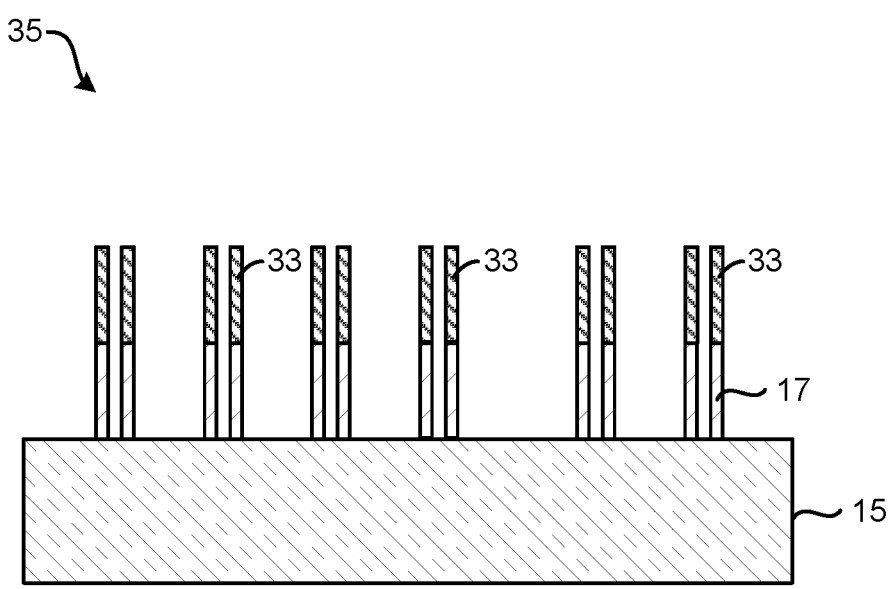

The remaining second spacer layer 33 shown in FIG. 6C may be used to further process the device 35. In one exemplary embodiment of the present invention, and as shown in FIG. 6D, the vertical portions of the second spacer layer 33 may be used as a mask to transfer the image pattern to at least a portion of the underlying layers. Specially, the thin film 17 and, if desired, the substrate 15, may be etched. Additional or alternative processes may then ensue.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A substrate processing method, comprising:
   forming a sacrificial film over a substrate;
   creating a pattern in the sacrificial film;
   conformally depositing a first spacer layer over the patterned sacrificial film;
   removing horizontal portions of the first spacer layer while substantially leaving vertical portions of the first spacer layer; and
   thereafter, performing a gas phase exposure, thereby selectively depositing a second spacer layer on the first spacer layer and not on the patterned sacrificial film, wherein the first spacer layer comprises a metal-containing layer that catalyzes the selective deposition of the second spacer layer on the first spacer layer.

2. The method of claim 1, wherein creating the pattern in the sacrificial film comprises:
   depositing, imaging, and developing a photo-resist layer;
   etching the sacrificial film in accordance with the imaged photo-resist layer; and
   removing the photo-resist layer.

3. The method of claim 1, wherein conformally depositing the first spacer layer includes vapor phase deposition.

4. The method of claim 1, wherein removing at least one horizontal portion of the first spacer layer includes removing a horizontal portion over a top surface of the sacrificial film.

5. The method of claim 1, wherein depositing the second spacer layer includes
   alternatingly depositing a metal-containing layer containing aluminum or titanium and a $SiO_2$ layer.

6. The method of claim 1, further comprising
   removing the sacrificial film after selectively depositing the second spacer layer, thereby forming a pattern containing the first and second spacer layers.

7. The method of claim 6, wherein a thin film is formed between the substrate and the sacrificial film, the method further comprising:
   using the vertical portions of the remaining first and second spacer layers as a mask to etch the thin film.

8. The method of claim 1, further comprising
   removing the sacrificial film after selectively depositing the second spacer layer; and
   removing the first spacer layer, thereby forming a pattern containing the second spacer layer.

9. The method of claim 8, wherein a thin film is formed between the substrate and the sacrificial film, the method further comprising:
   using the vertical portions of the remaining second spacer layer as a mask to etch the thin film.

10. The method of claim 1, further comprising
    removing the sacrificial film before selectively depositing the second spacer layer; and
    removing the first spacer layer, thereby forming a pattern containing the second spacer layer.

11. The method of claim 10, wherein a thin film is formed between the substrate and the sacrificial film, the method further comprising:
    using the vertical portions of the remaining second spacer layer as a mask to etch the thin film.

12. The method of claim 1, further comprising
    removing the sacrificial film before selectively depositing the second spacer layer.

13. The method of claim 12, wherein a thin film is formed between the substrate and the sacrificial film, the method further comprising:
    using the vertical portions of the remaining first and second spacer layers as a mask to etch the thin film.

14. The method of claim 1, wherein the metal-containing layer contains aluminum or titanium.

15. The method of claim 14, wherein the metal-containing layer is selected from the group consisting of Al, $Al_2O_3$, AlN, AlON, an Al-containing precursor, Ti, $TiO_2$, TiON, TiN, a Ti-containing precursor, and combinations thereof.

16. The method of claim 1, wherein the second spacer layer comprises a $SiO_2$ layer.

17. The method of claim 16, wherein the $SiO_2$ layer is deposited using a silanol gas phase exposure.

18. A substrate processing method, comprising:
    forming a sacrificial film over a substrate;
    creating a pattern in the sacrificial film;
    conformally depositing a first spacer layer over the patterned sacrificial film;
    removing horizontal portions of the first spacer layer while substantially leaving vertical portions of the first spacer layer;
    thereafter, selectively depositing a second spacer layer on the first spacer layer, wherein the selectively depositing the second spacer layer on the first spacer layer forms horizontal portions of the second spacer layer over a top surface of the first spacer layer;
    removing the sacrificial film after selectively depositing the second spacer layer; and
    removing the first spacer layer, thereby forming a pattern containing the second spacer layer, wherein removing the first spacer layer includes
    removing the horizontal portions of the second spacer layer over the top surface of the first spacer layer to expose the first spacer layer; and
    removing the exposed first spacer layer.

19. The method of claim 18, wherein the first spacer layer comprises a metal-containing layer that catalyzes the selective deposition of the second spacer layer on the first spacer layer.

20. A substrate processing method, comprising:
    forming a sacrificial film over a substrate;
    creating a pattern in the sacrificial film;
    conformally depositing a first spacer layer over the patterned sacrificial film;
    removing horizontal portions of the first spacer layer while substantially leaving vertical portions of the first spacer layer;
    removing the sacrificial film;
    thereafter, performing a gas phase exposure, thereby selectively depositing a second spacer layer on the first spacer layer;

removing the first spacer layer, thereby forming a pattern containing the second spacer layer, wherein removing the first spacer layer includes removing horizontal portions of the second spacer layer over a top surface of the first spacer layer to expose the first spacer layer; and removing the exposed first spacer layer.

* * * * *